United States Patent
Kawada et al.

(10) Patent No.: US 10,825,658 B2
(45) Date of Patent: Nov. 3, 2020

(54) ANTENNA AND PLASMA PROCESSING APPARATUS

(71) Applicant: TOKYO ELECTRON LIMITED, Tokyo (JP)

(72) Inventors: Yuki Kawada, Miyagi (JP); Koji Koyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 162 days.

(21) Appl. No.: 16/014,628

(22) Filed: Jun. 21, 2018

(65) Prior Publication Data

US 2018/0374678 A1 Dec. 27, 2018

(30) Foreign Application Priority Data

Jun. 22, 2017 (JP) .................. 2017-122451

(51) Int. Cl.
| | | |
|---|---|---|
| *B23K 10/00* | (2006.01) | |
| *H01J 37/32* | (2006.01) | |
| *C23C 16/511* | (2006.01) | |
| *H01L 21/3213* | (2006.01) | |
| *H01Q 1/36* | (2006.01) | |
| *H01Q 15/08* | (2006.01) | |

(Continued)

(52) U.S. Cl.
CPC ........ *H01J 37/3222* (2013.01); *C23C 16/511* (2013.01); *H01J 37/32238* (2013.01); *H01L 21/32137* (2013.01); *H01Q 1/366* (2013.01); *H01Q 13/10* (2013.01); *H01Q 15/08* (2013.01); *H01Q 21/0056* (2013.01); *H01Q 21/064* (2013.01); *H05H 1/46* (2013.01); *H01Q 1/42* (2013.01)

(58) Field of Classification Search
CPC .......... H01J 37/3222; H01L 21/32137; H01Q 13/10; H01Q 15/08; H01Q 21/0056; H01Q 21/064; H01Q 21/42; H05H 1/34; H05H 1/46
USPC .... 219/121.36, 121.48, 121.52, 121.59, 691, 219/728, 692
See application file for complete search history.

(56) References Cited

U.S. PATENT DOCUMENTS

| | | |
|---|---|---|
| 2013/0008607 A1 | 1/2013 | Matsumoto et al. |
| 2015/0118416 A1 | 4/2015 | Jang et al. |

(Continued)

FOREIGN PATENT DOCUMENTS

| | | |
|---|---|---|
| CN | 102867725 A | 1/2013 |
| CN | 104602436 A | 5/2015 |

(Continued)

*Primary Examiner* — Mark H Paschall
(74) *Attorney, Agent, or Firm* — Studebaker & Brackett PC

(57) ABSTRACT

In an antenna including a dielectric window and a slot plate provided on one surface of the dielectric window, in a case where a reference position g is a center position in a width direction of each slot S and a center position in a length direction in the slot plate, the reference position g of each slot is located on a virtual circle centered on a center of gravity G0, and line segments connecting the reference positions g of the slots S and virtual point G1 to which the slots belong are located radially from a virtual point G1, angles ($\beta 1$ to $\beta 4$) between adjacent line segments are equal to each other, and angles ($\theta 1$ to $\theta 4$) formed by the length directions of the slots S at the reference positions g and the line segments to which the slots belong are equal to each other.

13 Claims, 15 Drawing Sheets

(51) Int. Cl.
*H01Q 21/00* (2006.01)
*H01Q 21/06* (2006.01)
*H05H 1/46* (2006.01)
*H01Q 13/10* (2006.01)
*H01Q 1/42* (2006.01)

(56) References Cited

U.S. PATENT DOCUMENTS

2015/0279627 A1* 10/2015 Iwasaki ................ C23C 16/345
                                                                                  118/723 ME
2017/0229286 A1* 8/2017 Aita ..................... H01J 37/3222

FOREIGN PATENT DOCUMENTS

| JP | 2014-075234 A | 4/2014 |
| JP | 2015-130325 A | 7/2015 |
| WO | 2010/140526 A1 | 12/2010 |

* cited by examiner

*Fig.6A*    COMPARATIVE EXAMPLE 1 
*Fig.6B*    COMPARATIVE EXAMPLE 2 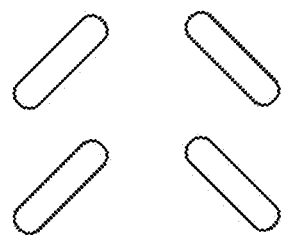
*Fig.6C*    EXAMPLE 1 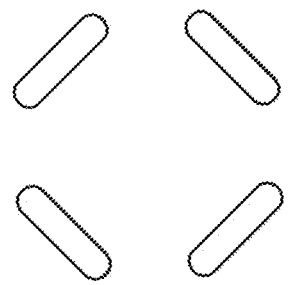

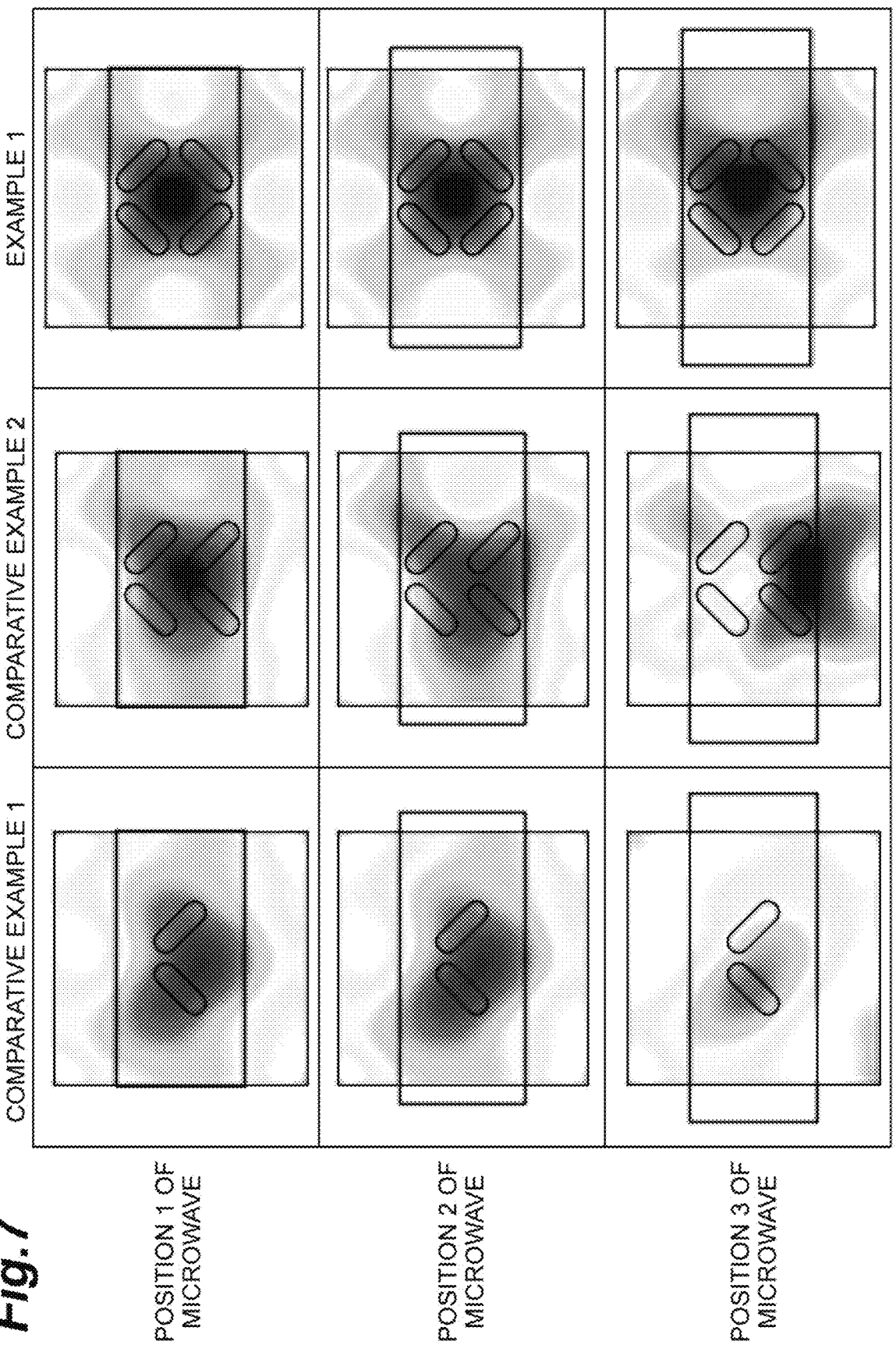

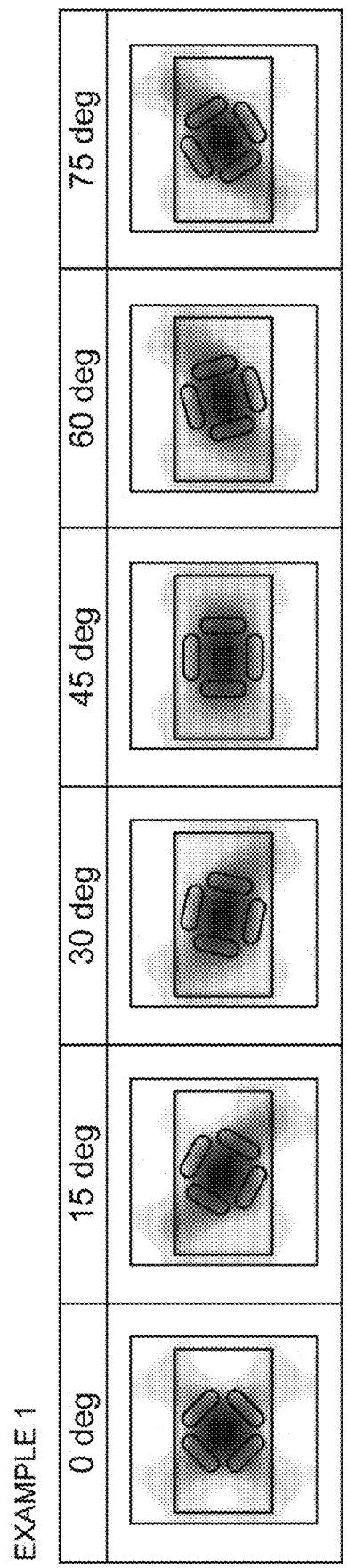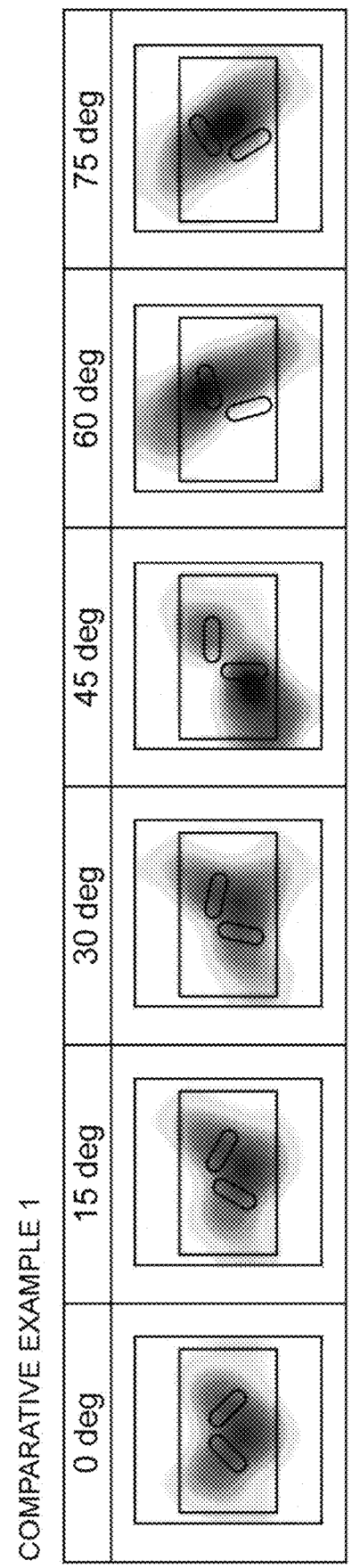
Fig.8A EXAMPLE 1
Fig.8B COMPARATIVE EXAMPLE 1

ANTENNA AND PLASMA PROCESSING APPARATUS

BACKGROUND OF THE INVENTION

Field of the Invention

Aspects of the present invention relates to an antenna and a plasma processing apparatus.

Related Background Art

In the related art, plasma processing apparatuses are described in, for example, Patent Document 1 and Patent Document 2. These plasma processing apparatuses are etching apparatuses using a radial line slot antenna. The antenna has a slot plate and a dielectric window. When the antenna is irradiated with a microwave, the microwave is radiated from the dielectric window into a processing vessel. The gas which receives the energy of the microwave is turned into plasma, and thus plasma is generated.

Patent Document 1: Japanese Unexamined Patent Publication No. 2015-130325.
Patent Document 2: Japanese Unexamined Patent Publication No. 2014-075234.

SUMMARY

However, in a case where plasma is generated using the antenna in the related art, the radiation intensity and position of the microwave radiated from the antenna may be unstable due to the load fluctuation of the plasma or the like. The present invention has been made in view of such problems, and an object is to provide an antenna and a processing apparatus capable of improving plasma stability.

The inventors of the present invention have conducted intensive studies and found that the plasma stability depends on the position of the standing wave formed by the microwave and the surface current of the slot plate, and the position and the direction of the slot in the slot plate satisfy a predetermined condition, which makes it possible to greatly increase the stability.

An antenna according to a first aspect is an antenna including a dielectric window and a slot plate provided on one surface of the dielectric window, in which in a case of setting a plurality of virtual points on an virtual circle surrounding the center of the slot plate, on the slot plate, setting a virtual annular line surrounding the vicinity of each virtual point, and setting a set including four or more slots disposed along each virtual annular line as a slot group, in a case where a reference position is a center position in a width direction and a center position in a length direction of each slot, in each slot group, the reference position of each slot is located on the virtual annular line, line segments connecting the reference positions of the slots and the virtual points to which the slots belong are located radially from the virtual point, and angles between adjacent line segments are equal to each other, and angles formed by the length directions of the slots at the reference positions and the line segments to which the slots belong are equal to each other.

According to the above antenna, four or more slots are isotropically disposed as described above, and in such a slot arrangement, the radiated electric field from the slot is very stable. Therefore, even if the load of the plasma fluctuates, the plasma can be stably generated.

In particular, the microwaves introduced to the central portion of the slot plate through the coaxial waveguide propagates radially from the central portion to the peripheral portion, but a standing wave is generated at the position of each slot, the energy concentrates, and then, plasma is likely to be generated. The reference position of four or more slot groups surrounding a specific virtual point has rotational symmetry with respect to the virtual point, the standing wave of the radiated electric field whose amplitude reference position is controlled around each slot overlap each other stably, and the radiated electric field is strongly stabilized. Since such a stable radiated electric field is located on the virtual point disposed in a circle so as to surround the center of the slot plate, in the plane of the slot plate, plasma is generated stably, in the vicinity of each slot group.

In the antenna according to a second aspect, the shape of the slot is a shape extending linearly so that the orientation in the length direction does not change.

Various shapes of slots are conceivable, and as long as the orientation in the length direction does not change, there is an advantage that it is easy to form slots and it is easy to control the direction of the amplitude of the radiated electric field.

In the antenna according to a third aspect, the shape of the slot is a rectangle shape or an elongated hole shape. A representative shape in which the orientation in the length direction does not change is a rectangle, but since the corner portion of the rectangle has a high frequency component as a spatial shape, it may be an elongated hole shape with rounded corners. In this case, it is possible to suppress generation of a noise like radiated electric field caused by a high frequency component.

In the antenna according to a fourth aspect, the shape of the slot is an arc shape. In such a shape, it is easy to control the generated electric field.

A plasma processing apparatus using any one of the above-described antennas includes an antenna, a processing vessel to which the antenna is attached, a base which is provided inside the processing vessel and faces the dielectric window, and on which the substrate to be processed is placed, and a microwave generator that supplies a microwave to the antenna.

Since the plasma processing apparatus can generate plasma with high stability similarly to the above-described antenna, it is possible to perform a stable process on the substrate to be processed.

According to the antenna and the plasma processing apparatus of the present invention, the plasma stability can be improved.

BRIEF DESCRIPTION OF THE DRAWINGS

FIG. 6A shows Comparative Example 1, FIG. 6B shows Comparative Example 2, and FIG. 6C shows the pattern of the slot group of Example 1.

FIG. 7 is a diagram showing the electric field distribution in the case of various conditions.

FIG. 8A is a diagram showing electric field distribution in the case of various conditions in Example 1 and FIG. 8B is a diagram showing electric field distribution in the case of various conditions in Comparative example 1.

DESCRIPTION OF THE PREFERRED EMBODIMENTS

Figure 1:
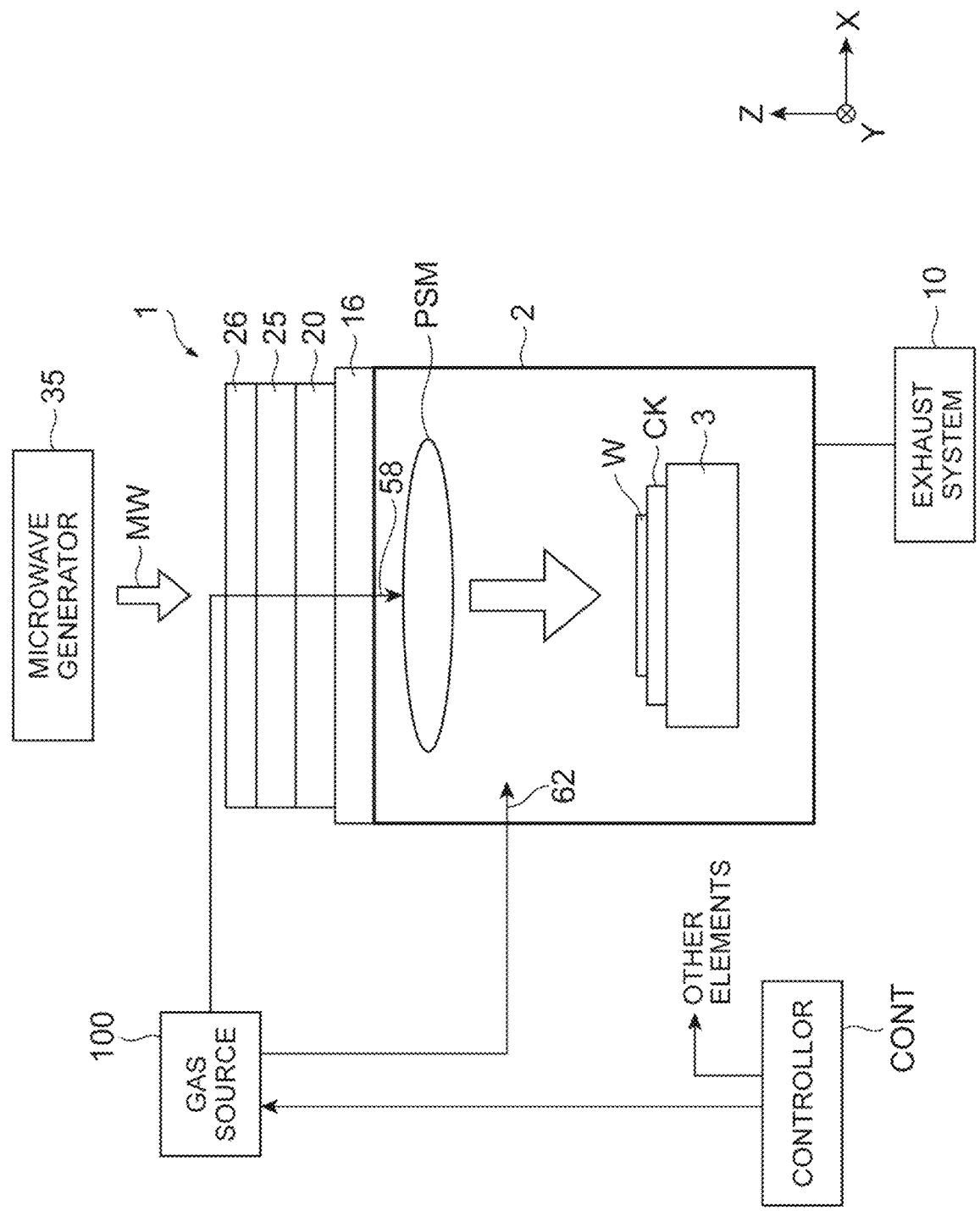
FIG. 1 is a schematic diagram of a plasma processing apparatus.

Hereinafter, a dielectric window, an antenna, and a plasma processing apparatus according to an embodiment will be described. The same reference numerals are used for the same elements, and redundant explanations are omitted.

FIG. 1 is a schematic diagram of a plasma processing apparatus. The vertical direction is a Z-axis direction, the direction perpendicular to the Z axis is an X-axis direction, and the direction perpendicular to both the X axis and the Z axis is an Y-axis direction.

A plasma processing apparatus 1 includes a cylindrical processing vessel 2. The ceiling portion of the processing vessel 2 is closed with a dielectric window 16 (top plate) made of a dielectric material. The processing vessel 2 is made of, for example, aluminum and electrically grounded. The inner wall surface of the processing vessel 2 is covered with an insulating protective film such as alumina.

A base 3 for placing a semiconductor wafer (hereinafter referred to as a wafer) W, which is a substrate, is provided at the center of the bottom of the processing vessel 2. The wafer W is held on the upper surface of the base 3. The base 3 is made of a ceramic material such as alumina or aluminum nitride, for example. A heater (not shown) connected to a power source is embedded in the base 3 so that the wafer W can be heated to a predetermined temperature.

On the upper surface of the base 3, an electrostatic chuck CK electrostatically chucking the wafer W placed on the base 3 is provided. The electrostatic chuck CK is connected to a biasing power source applying bias DC or high-frequency power (RF power) through a matching unit.

An exhaust pipe for exhausting the processing gas from an exhaust port below the surface of the wafer W placed on the base 3 is provided at the bottom of the processing vessel 2, and an exhaust system 10 such as a vacuum pump is connected to the exhaust pipe. By the exhaust system 10, the pressure in the processing vessel 2 is adjusted to a predetermined pressure.

A dielectric window 16 is provided on the ceiling portion of the processing vessel 2 through a seal such as an O ring for securing airtightness. The dielectric window 16 is made of a dielectric material such as quartz, alumina ($Al_2O_3$), aluminum nitride (AlN), or the like, and has permeability to a microwave.

On the upper surface of the dielectric window 16, a disk-shaped slot plate 20 is provided. The slot plate 20 is made of a material having conductivity, for example, copper plated or coated with Ag, Au or the like. In the slot plate 20, a plurality of slot groups are arranged in a circular shape so as to surround the center thereof. In a case where the number of slot groups is large, it is also possible to dispose the slot groups concentrically.

On the upper surface of the slot plate 20, a dielectric plate (slow wave plate) 25 for compressing the wavelength of the microwave is disposed. The dielectric plate 25 is made of a dielectric material such as quartz ($SiO_2$), alumina ($Al_2O_3$), aluminum nitride (AlN), or the like. The dielectric plate 25 is covered with a conductive cover 26. An annular heat medium flow path is provided in the cover 26, and the cover 26 and the dielectric plate 25 are adjusted to a predetermined temperature by the heat medium flowing through the heat medium flow path. Taking a microwave with a wavelength of 2.45 GHz as an example, the wavelength in the vacuum is about 12 cm, and the wavelength in the dielectric window 16 made of alumina is about 3 to 4 cm.

A coaxial waveguide (not shown) that propagates microwaves is connected to the center of the cover 26, the coaxial waveguide is configured with an inner conductor and an outer conductor. The inner conductor penetrates the center of a dielectric plate 25 and is connected to the center of the slot plate 20. A microwave generator 35 is connected to the coaxial waveguide through a mode converter and a rectangular waveguide. With respect to the microwave, a microwave of 860 MHz, 915 MHz, 8.35 GHz or the like in addition to 2.45 GHz can be used.

The microwave MW generated by the microwave generator 35 propagates to the dielectric plate 25 through the rectangular waveguide, the mode converter, and the coaxial waveguide as microwave introduction paths. The microwave MW propagating to the dielectric plate 25 is supplied into the processing vessel 2 from the plurality of slots of the slot plate 20 through the dielectric window 16. An electric field is formed by a microwave below the dielectric window 16, and the processing gas in the processing vessel 2 is turned into plasma. That is, when the microwave MW is supplied from the microwave generator 35 to the antenna, plasma is generated.

The lower end of the inner conductor connected to the slot plate 20 is formed in a truncated cone shape, and a microwave efficiently propagates from the coaxial waveguide to the dielectric plate 25 and the slot plate 20 without loss.

The feature of the microwave plasma generated by the radial line slot antenna is that the plasma of energy having a relatively high electron temperature generated in the region PSM (plasma excitation region) immediately below the dielectric window 16 diffuses downward as indicated by the large arrow, and plasma of low electron temperature of about 1 to 2 eV is obtained in the region (diffusion plasma region) right above the wafer W. That is, unlike parallel flat plate plasma or the like, the distribution of the electron temperature of the plasma clearly occurs as a function of the distance from the dielectric window 16. More specifically, the electron temperature of several eV to about 10 eV in the region immediately below the dielectric window 16 is attenuated to about 1 to 2 eV in the region right above the wafer W. Since the wafer W is processed in a region with a low electron temperature of the plasma (diffusion plasma region), large damage such as recess is not applied to the wafer W. When a processing gas is supplied to a region with a high electron temperature of the plasma (plasma excitation region), the processing gas is easily excited and dissociated.

On the other hand, when a processing gas is supplied to a region with a low electron temperature of the plasma (plasma diffusion region), the degree of dissociation is suppressed as compared with the case where the processing gas is supplied to the vicinity of the plasma excitation region.

A central introduction portion 55 (see FIG. 10B) for introducing a processing gas into the center part of the wafer W is provided in the center of the dielectric window 16 in the ceiling part of the processing vessel 2, and the central introduction portion is connected to a processing gas supply path. The processing gas supply path is a supply path in the inner conductor of the above-described coaxial waveguide.

The central introduction portion has a cylindrical block (not shown) fitted into a cylindrical space portion 143 (see FIG. 10B) provided at the center of the dielectric window 16, and a tapered space portion 143a (see FIG. 10B) in which a columnar space having a gas ejection opening is continuous to the tip part. This block is made of a conductive material such as aluminum, for example, and is electrically grounded. An aluminum block can be coated with anodic oxide film alumina ($Al_2O_3$), yttria ($Y_2O_3$) or the like. A plurality of central introduction ports 58 penetrating in the vertical direction are formed in the block, and there is a gap (gas reservoir) between the upper surface of the block and the lower surface of the inner conductor of the coaxial waveguide. The planar shape of the central introduction port 58 is formed into a perfect circle or a long hole in consideration of necessary conductance and the like.

The shape of the space portion 143a is not limited to a tapered shape, and may be a simple cylindrical shape.

The processing gas supplied to the gas reservoir on the above-described block is diffused in the gas reservoir, and then injected downward from a plurality of central introduction ports provided in the block and toward the center part of the wafer W.

A ring-shaped peripheral introduction portion that supplies the processing gas to the peripheral portion of the wafer W may be disposed inside the processing vessel 2 so as to surround the upper periphery of the wafer W. The peripheral introduction portion is disposed below the central introduction port 58 disposed in the ceiling part and above the wafer W placed on the base 3. The peripheral introduction portion is formed by annularly disposing a hollow pipe, and a plurality of the peripheral introduction ports 62 are formed on the inner peripheral side of the processing vessel 2 with a constant interval in the circumferential direction. The peripheral introduction port 62 injects the processing gas toward the center of the annular peripheral introduction portion. The peripheral introduction portion is made of, for example, quartz. A supply path made of stainless steel penetrates the side surface of the processing vessel 2, and the supply path is connected to the peripheral introduction port 62 of the peripheral introduction portion. The processing gas supplied from the supply path to the peripheral introduction portion is injected from the plurality of peripheral introduction ports 62 toward the inside of the peripheral introduction portion. The processing gas injected from the plurality of peripheral introduction ports 62 is supplied to the upper peripheral part of the wafer W. Instead of providing the ring-shaped peripheral introduction portion, a plurality of peripheral introduction ports 62 may be formed on the inner surface of the processing vessel 2.

The processing gas is supplied from the gas source 100 to the central introduction port 58 and the peripheral introduction port 62, which are described above. The gas supply source 100 includes a common gas source and an additive gas source and supplies a processing gas according to various processes such as a plasma etching process and a plasma CVD process. By controlling the flow rates of gases from a plurality of gas sources by the flow rate control valves provided in the respective supply paths and mixing the gases, it is possible to prepare a target processing gas. These flow rate control valves can be controlled by the control unit CONT. The controller CONT is a computer, and it can also control activation of the microwave generator 35, heating of the wafer W, exhaust processing by the exhaust system 10, and the like.

The processing gases from the common gas source and the additive gas source are mixed at an appropriate ratio according to the purpose, and the mixed gas is supplied to the central introduction ports 58 and the peripheral introduction ports 62, respectively.

For example, as a gas used for the common gas source, a rare gas (such as Ar) can be used, but other additive gases can be used. Further, when etching a silicon-based film such as polysilicon, Ar gas, HBr gas (or $Cl_2$ gas), and $O_2$ gas are supplied as an additive gas. When an oxide film such as $SiO_2$ is etched, Ar gas, CHF-based gas, CF-based gas, and $O_2$ gas are supplied as an additive gas. When a nitride film such as SiN or the like is etched, Ar gas, CF-based gas, CHF-based gas, $O_2$ gas are supplied as an additive gas.

Incidentally, examples of the CHF-based gas include $CH_3(CH_2)_3CH_2F$, $CH_3(CH_2)_4CH_2F$, $CH_3(CH_2)_7CH_2F$, $CHCH_3F_2$, $CHF_3$, $CH_3F$ and $CH_2F_2$.

Examples of the CF-based gas include $C(CF_3)_4$, $C(C_2F_5)_4$, $C_4F_3$, $C_2F_2$, and $C_5F_8$, and $C_5F_8$ is preferable from the viewpoint of obtaining dissociated species suitable for etching.

A central introduction gas Gc is supplied to the central introduction port 58 and a peripheral introduction gas Gp is supplied to the peripheral introduction port 62. With respect to the central introduction gas Gc which is supplied to the center portion of the wafer W and the peripheral introduction gas Gp which is supplied to the peripheral portion, the partial pressure for each gas type and the gas type itself can be changed, and the characteristics of the plasma treatment can be changed variously. The same type of gas can be supplied from the common gas source and the additive gas source, or different types of gas can be supplied from the common gas source and the additive gas source.

In order to suppress the dissociation of the etching gas, a plasma excitation gas may be supplied from the common gas source and an etching gas may be supplied from the additive gas source. For example, when etching a silicon-based film, only Ar gas is supplied as a plasma excitation gas from the common gas source, and only HBr gas and $O_2$ gas are supplied as an etching gas from the additive gas source. The common gas source can also supply a cleaning gas such as $O_2$, and $SF_6$, or other common gases. Further, the above gas may contain a so-called negative gas. The negative gas refers to a gas having an electron attachment cross section at an electron energy of 10 eV or less. Examples include HBr, $SF_6$, or the like.

A technique for adjusting the branching ratio of the common gas by the flow splitter and adjusting the gas introduction amount from the central introduction port 58 and the peripheral introduction port 62 for the purpose of generating uniform plasma and processing of the wafer W uniform in the surface is called Radical Distribution Control (RDC). The RDC is represented by the ratio between the gas introduction amount from the central introduction port 58 and the gas introduction amount from the peripheral introduction port 62. A general RDC is a case where the types of gases supplied into the chamber from the central introduction port 58 and the peripheral introduction port 62 are common. The optimum RDC value is experimentally determined by the type of film to be etched and various conditions, and a uniform etching rate can be achieved.

As described above, the antenna according to the embodiment includes a dielectric window 16 and a slot plate 20 provided on one surface (the surface opposite to the processing vessel) of the dielectric window 16. In the plasma processing apparatus shown in FIG. 1, the configuration except the slot plate 20 is a general one, and various configurations are possible. Next, the slot plate 20 constituting the antenna will be described.

Figure 2:
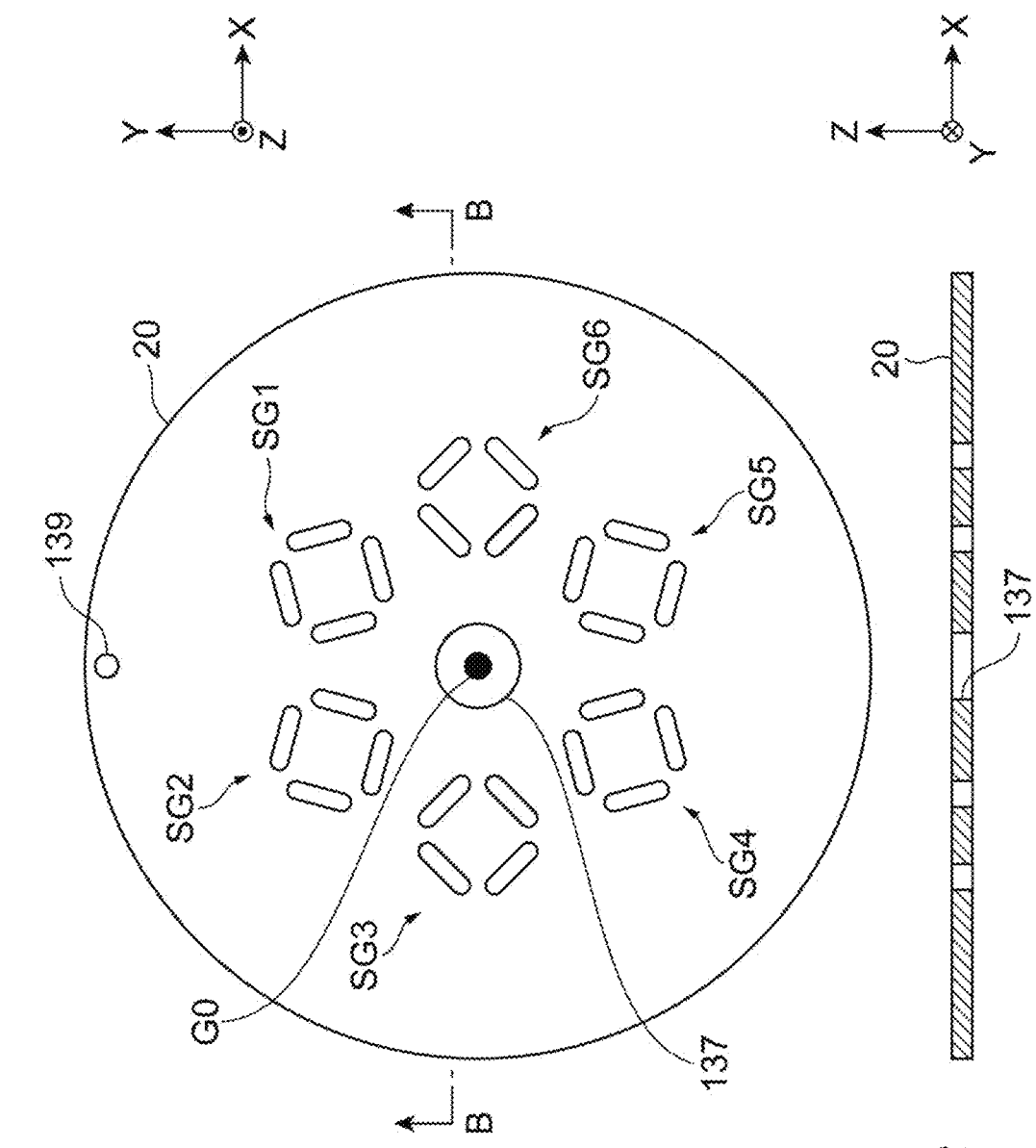
FIG. 2A is a plan view of a slot plate.
FIG. 2B is a cross-sectional view taken along an arrow B-B.

FIG. 2A is a plan view (XY plane) of a slot plate, and FIG. 2B is a cross-sectional view (XZ cross section) taken along an arrow B-B.

The slot plate 20 is made of a circular conductor, and a through hole 137 through which a pipe for supplying the processing gas is passed is provided at the center thereof. In addition, slot groups SG1 to SG6 are disposed around the through hole 137 in a circular shape, and the slot groups SG1 to SG6 have rotational symmetry about the through hole 137. This is because plasma with less dependence on the rotation angle around the Z axis is generated. The patterns of the slot groups SG1 to SG6 have the same rotation angle or different rotation angles depending on the positions.

In the region of the peripheral portion of the slot plate 20, a reference hole 139 is provided so as to penetrate in the plate thickness direction in order to facilitate the positioning of the slot plate 20 in the circumferential direction. That is, the positioning of the slot plate 20 in the circumferential direction with respect to the processing vessel 2 and the dielectric window 16 is performed using the position of the reference hole 139 as a mark. The slot plate 20 as a whole has rotational symmetry about the position of the center of gravity of the through hole 137 except for the reference hole 139. In FIGS. 2A and 2B, one slot group has four slots (through holes), but the number of slots may be four or more. Further, it is desirable that the number of slots in one slot group is eight or less.

Figure 3:
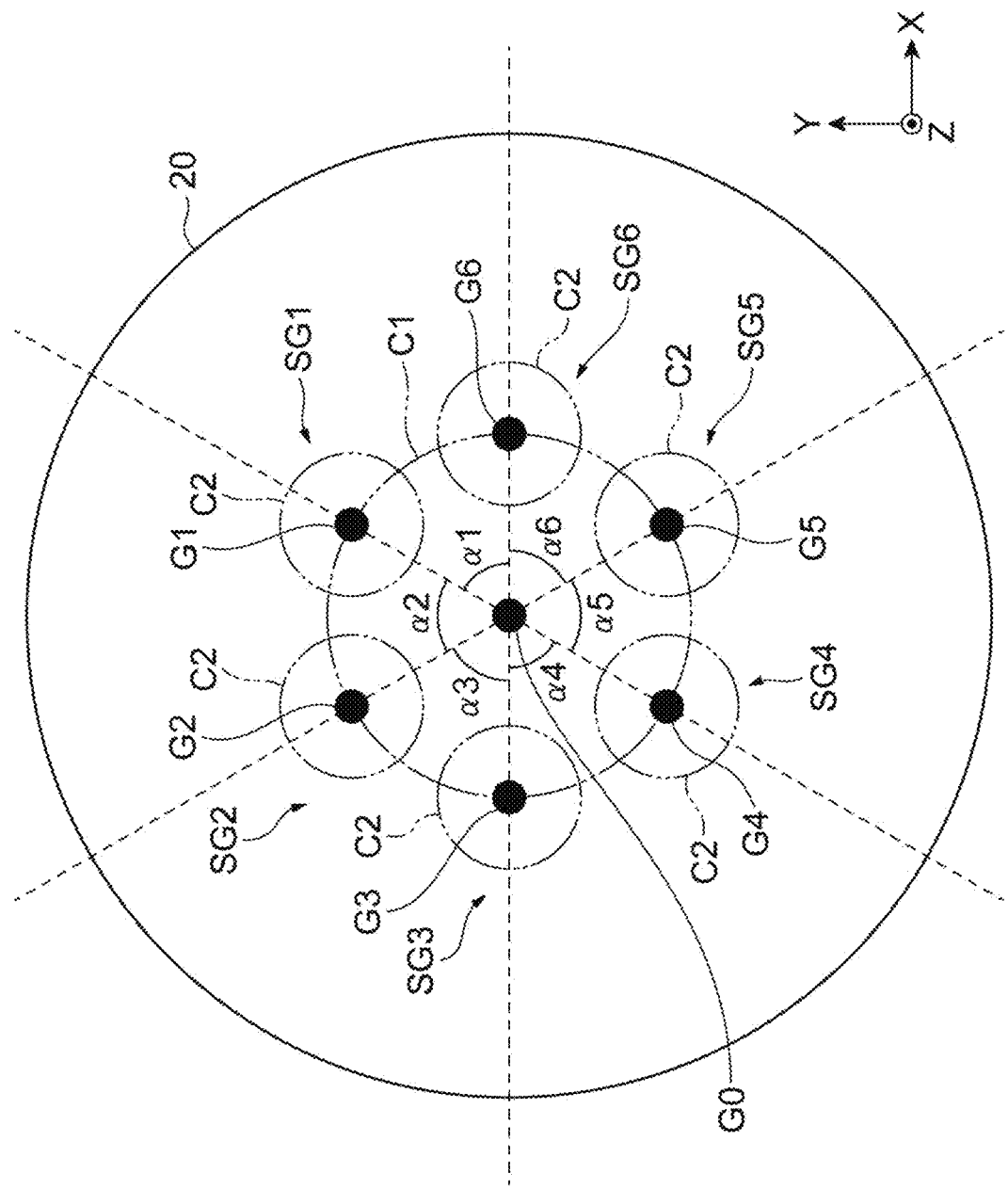
FIG. 3 is a plan view for explaining the pattern on the slot plate.

FIG. 3 is a plan view (XY plane) for explaining the pattern on the slot plate.

In defining one slot group, first, on the slot plate 20, a plurality of virtual points (G1 to G6) are set on a virtual circle (first virtual circle C1) surrounding the center of the slot plate 20 (the center of gravity G0 of the through hole 137 shown in FIGS. 2A and 2B). A virtual annular line (second virtual circle C2) surrounding the vicinity of each of the virtual points (G1 to G6) is set, and a set of four or more slots S (see FIG. 4) disposed along each virtual annular line is referred to as a slot group (SG1 to SG6).

The virtual points G1 to G6 are disposed at equal intervals around the center of gravity G0. That is, a line segment connecting the center of gravity G0 and the virtual point G6 and a line segment connecting the center of gravity G0 and the virtual point G1 form an angle α1 (acute angle). Similarly, a line segment connecting the center of gravity G0 and the virtual point G1 and a line segment connecting the center of gravity G0 and the virtual point G2 form an angle α2 (acute angle). A line segment connecting the center of gravity G0 and the virtual point G2 and a line segment connecting the center of gravity G0 and the virtual point G3 form an angle α3 (acute angle). A line segment connecting the center of gravity G0 and the virtual point G3 and a line segment connecting the center of gravity G0 and the virtual point G4 form an angle α4 (acute angle). A line segment connecting the center of gravity G0 and the virtual point G4 and a line segment connecting the center of gravity G0 and the virtual point G5 form an angle α5 (acute angle). A line segment connecting the center of gravity G0 and the virtual point G5 and a line segment connecting the center of gravity G0 and the virtual point G6 form an angle α6 (acute angle). Here $\alpha 1=\alpha 2=\alpha 3=\alpha 4=\alpha 5=\alpha 6$ and $\alpha 1+\alpha 2+\alpha 3+\alpha 4+\alpha 5+\alpha 6=360°$. The pattern of the slot group has rotational symmetry with respect to the center of gravity G0, but the shape of each slot group is the same. Therefore, only one slot group will be explained as a representative.

In a case where the number of the slot groups is X, the radius of the first virtual circle C1 is r, the circumference ratio is π, and the wavelength of the microwave is λ, it is preferably set so that $2\pi r/X = \lambda \times \text{integer}$. This is because the continuity of the standing wave in the circumferential direction is given.

Figure 4:
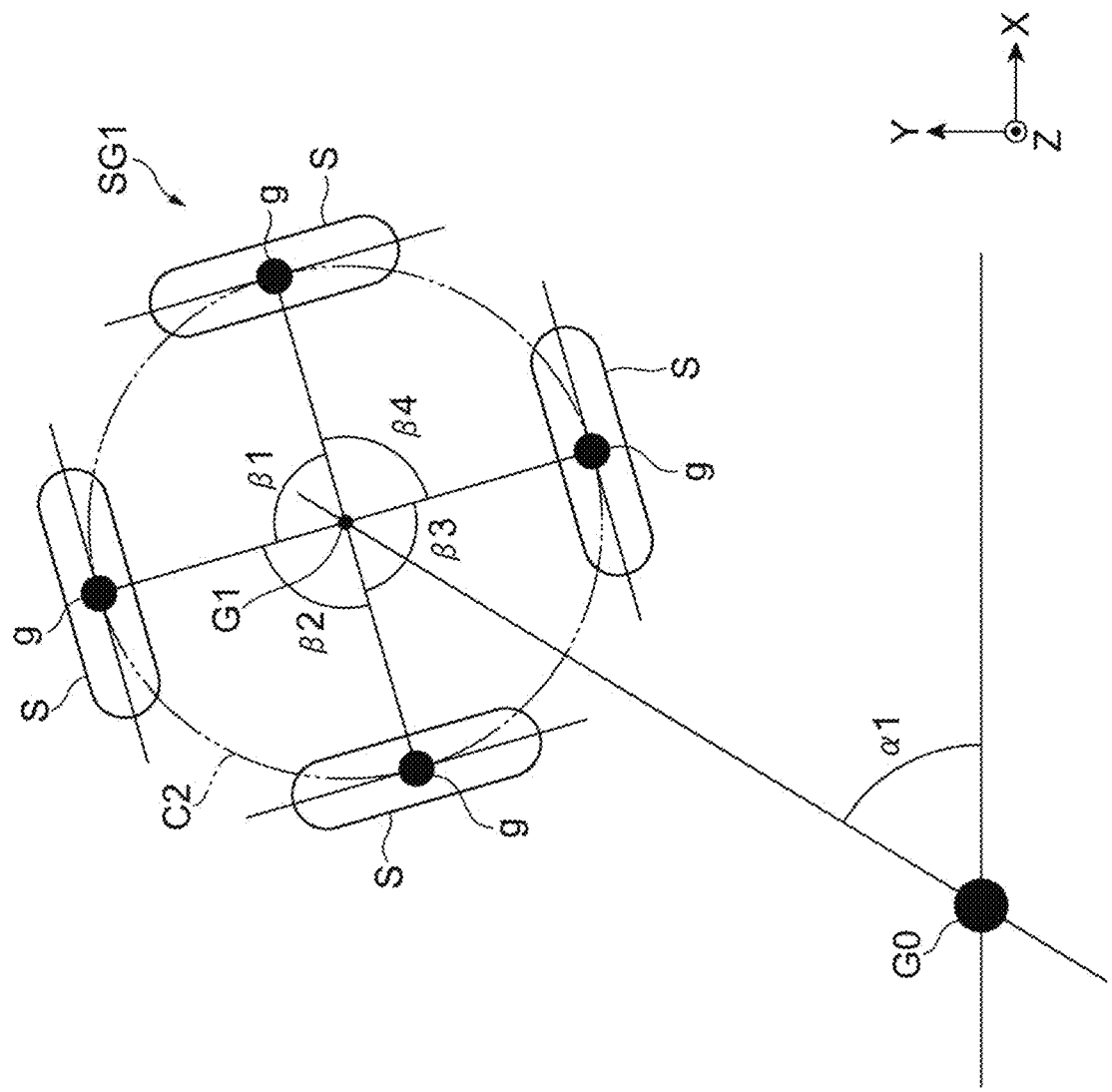
FIG. 4 is a diagram for explaining a pattern of one slot group.

FIG. 4 is a diagram for explaining a pattern of one slot group.

Figure 13D:
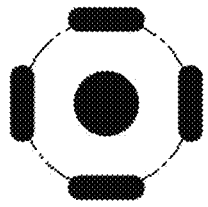
FIG. 13A, FIG. 13B, FIG. 13C, FIG. 13D, FIG. 13E, FIG. 13F, FIG. 13G, FIG. 13H, FIG. 13I, FIG. 13J, and FIG. 13K are diagrams showing examples of patterns of one slot group, respectively.
Figure 13C:
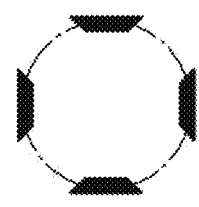
Figure 13B:
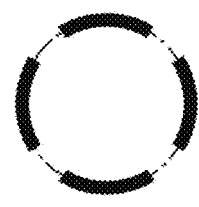

As represented in FIG. 4, in the slot pattern described above, in each slot group, in a case where a reference position g (the center of gravity of the slot) is a center position in a width direction of each slot S and a center position in a length direction, the reference position g of each slot S is located on a virtual annular line (second virtual circle C2), and line segments connecting the reference positions g of the slots S and virtual points (G1) to which the slots S belong are located radially from the virtual point (G1), angles (β1 to β4) between adjacent line segments are equal to each other, but may include an error of about 5%. The angles formed by the length directions of the slots S at the reference positions g and the line segments to which the slots S belong are equal to each other, but may include an error of about 5%. In FIG. 4, $\theta 1=\theta 2=\theta 3=\theta 4=90°$ where the angle (90° or less) is θ1, θ2, θ3, θ4 as shown in FIG. 13G, but an error of about 5% may be included. In addition, it is established that 45°<θ1, 45°<θ2, 45°<θ3, and 45°<θ4. In addition, patterns in which each slot group is vertically or horizontally reversed exhibit the same effect.

Figure 5:
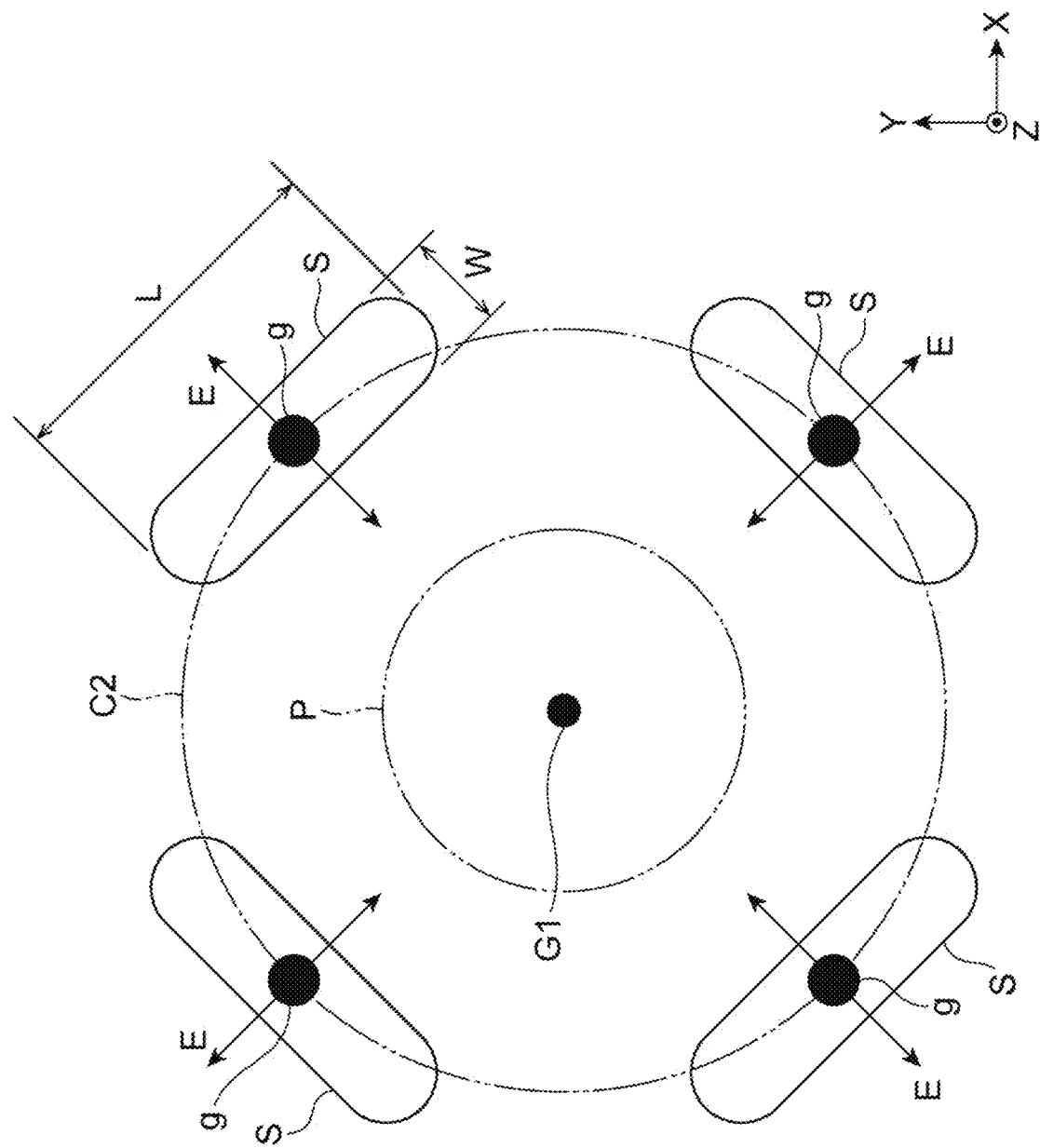
FIG. 5 is a diagram for explaining a pattern of one slot group.

FIG. 5 is a diagram for explaining a pattern of one slot group.

According to the antenna, four or more slots S are isotropically disposed, and in such a slot arrangement, the radiated electric field from the slot S is very stable. The dimension L in the length direction of the slot S and the dimension W in the width direction satisfy L>W. The electric field E along the width direction of the slot S forms a high electric field region P which stably overlaps and hardly moves at the center part of the second virtual circle C2. Since plasma is generated corresponding to the high electric field region P, even if the load of the plasma fluctuates, the plasma can be stably generated.

In particular, the microwave introduced to the central portion of the slot plate through the coaxial waveguide propagates radially from the central portion to the peripheral portion, but a standing wave is generated at the position of each slot S, the energy concentrates, and then, plasma is likely to be generated. The reference position g of four or more slot groups surrounding a specific virtual point G1 has rotational symmetry with respect to the virtual point G1, a standing wave of the radiated electric field whose amplitude reference position is controlled around each slot overlap each other stably, and the radiated electric field is strongly stabilized. Since such a stable radiated electric field is located on the virtual point (virtual point G0 shown in FIG. 3) disposed in a circle so as to surround the center of the slot plate 20, in the plane of the slot plate 20, plasma Is generated stably, in the vicinity of each slot group.

In FIG. 5, for the sake of clarity, a slit is displayed slightly separated from the center of gravity G1, but the radius of the second virtual circle C2 is preferably $L/2^{0.5}$. Thus, it is considered that slots are formed in which the intervals between adjacent slots do not overlap, and a stable radiated electric field is generated.

Next, in order to verify the effect, comparison between comparative examples and the example is made.

FIG. 6A shows Comparative Example 1, FIG. 6B shows Comparative Example 2, and FIG. 6C shows the pattern of the slot group of Example 1.

FIG. 6A is a pattern of Comparative Example 1, which has only the upper two slots of the pattern (FIG. 6C) of Example 1 shown in FIG. 5. FIG. 6B is a pattern of Comparative Example 2, which is a pattern obtained by vertically reversing lower two slots of the pattern (FIG. 6C) of Example 1 shown in FIG. 5.

Figure 15:
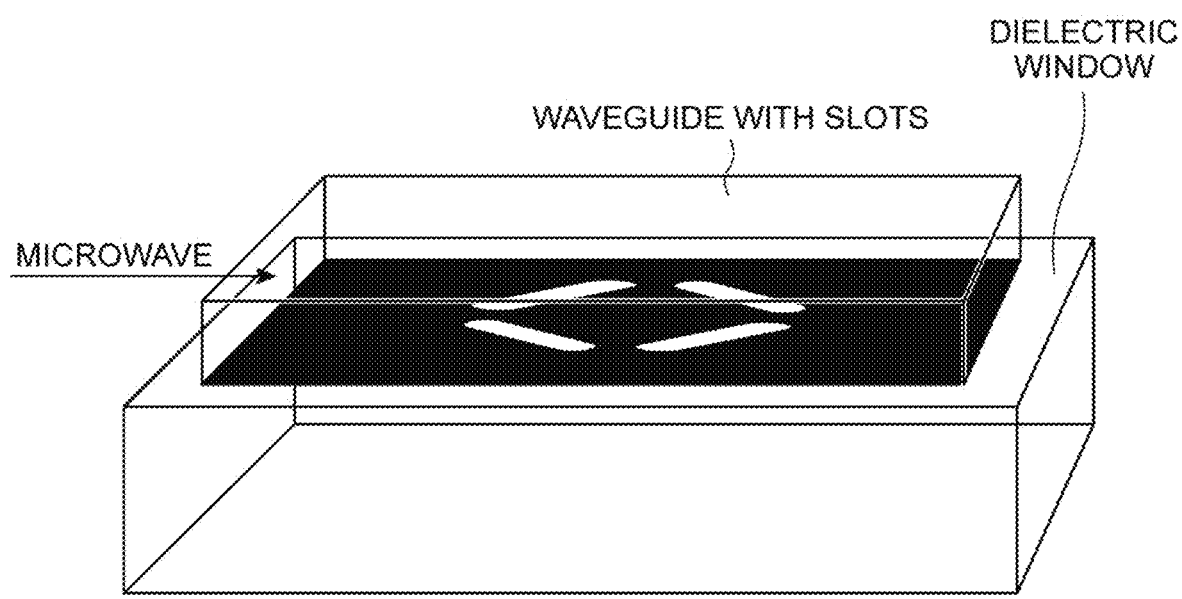
FIG. 15 is a perspective view of a simplified model including the pattern of the slot plate.

In order to investigate the electric field distributions in the patterns of FIGS. 6A to 6C, a simplified model as shown in FIG. 15 is prepared. In the plasma processing apparatus described above, a metal slot plate is disposed on the dielectric window, and a dielectric plate (slow wave plate) is disposed on the slot plate. Therefore, in a simplified model, as shown in FIG. 15, a $Al_2O_3$ (alumina) plate with a thickness of 15 mm is prepared as the dielectric window, a waveguide made of $Al_2O_3$ (alumina) with a thickness of 7 mm is prepared as a slow wave plate, and a thin slot plate is disposed on the lower surface of the waveguide, thereby preparing a waveguide with slots. Therefore, in this model, the slot plate is sandwiched between the dielectric window and the waveguide simulating the slow wave plate.

FIG. 7 is configuration diagrams and results in a case where the electric field distributions in the patterns of the slot groups shown in FIGS. 6A to 6C are calculated by simple simulation. In FIG. 7, the darker the color, the stronger the electric field.

A microwave (power 1 W) in the TE 10 mode is input from one end of the waveguide having the patterns shown in FIGS. 6A to 6C, and the electric field intensity distribution on the bottom surface (lower surface) of the dielectric window is calculated. At this time, the length L of the slot is 17 mm and the width W is 6 mm. In Example 1 using the above simplified model, the radius of the virtual circle C2 is 12 mm.

The position 1 of the microwave is a position where the antinode of the microwave amplitude is located in the vicinity of the position of the center of gravity of each slot group, the position 3 of the microwave is a position where the node of the microwave amplitude is located in the vicinity of the position of the center of gravity of each slot group, and the position 2 of the microwave is a position where the middle position between the antinode and the node of the microwave amplitude is located in the vicinity of the position of the center of gravity of each slot group. In the case where fluctuation occurs in the propagation of the microwave, it is conceivable to take the state of the position 1 to the position 3. However, in comparison with Comparative Example 1 and Comparative Example 2, it is found that the region with high electric field intensity is hard to change due to the fluctuation of position 1 to position 3, in the case of Example 1. As described above, in the case of Example 1, it is found that the robustness of the electric field intensity distribution is high with respect to the fluctuation of the propagation of the microwave, and hence the change of the plasma generation region is also small.

Next, the change in the electric field intensity distribution in a case where one slot group is rotated is checked.

FIG. 8A (Example 1) and FIG. 8B (Comparative Example 1) are diagrams showing the electric field distribution (simulation) in the case of various conditions, the conditions other than the rotation angle of the slot group are the same as above and the position 1 is adopted as the state of the microwave. In FIGS. 8A and 8B, the darker the color, the stronger the electric field.

In the case of the slot pattern of Comparative Example 1, when the rotation angle is varied from 0° to 75°, the position of the region with high electric field intensity fluctuates. However, in Example 1, the position hardly fluctuates and is localized in the vicinity of the center of gravity of the slot group as described above, even in a case where one slot group is rotated around the center of gravity G1 (see FIG. 5), it is checked that the position of plasma generation hardly changes.

Next, an example of the dielectric window 16 will be described.

Figure 9A:
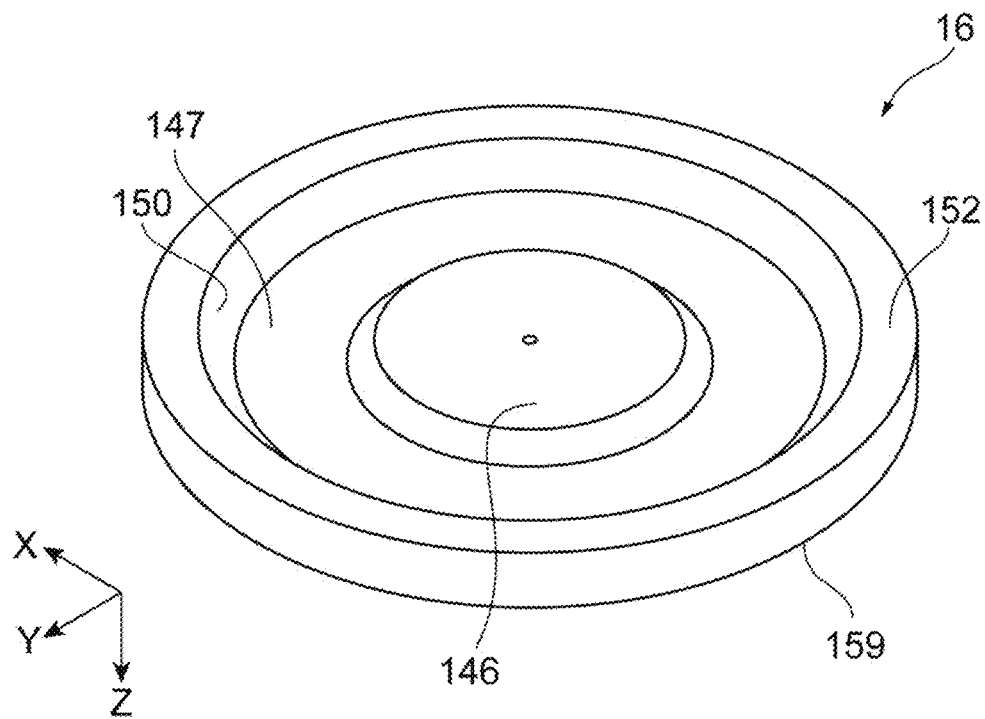
FIG. 9A is a perspective view of a dielectric window according to an example.
Figure 9B:
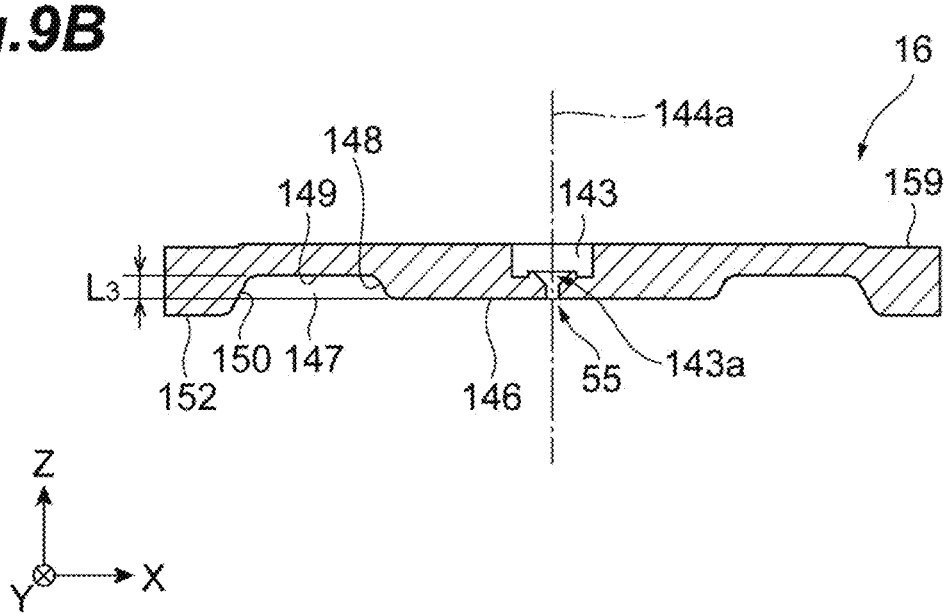
FIG. 9B is a longitudinal sectional view of the dielectric window.

FIG. 9A is a perspective view of a dielectric window according to an example, and FIG. 9B is a longitudinal sectional view of the dielectric window. In FIG. 9A, the dielectric window is shown by reversing the top and bottom so that the structure of the recess can be seen.

The dielectric window 16 has a substantially disk shape and has a predetermined plate thickness. The dielectric window 16 is made of a dielectric material, and concrete materials of the dielectric window 16 include quartz, alumina, and the like. On the upper surface 159 of the dielectric window 16, a slot plate 20 is provided.

At the center in the radial direction of the dielectric window 16, through holes that penetrate in the plate thickness direction, that is, in the up and down direction of the paper surface are provided. In the through hole, the lower region is a gas supply port in the central introduction portion 55, and the upper region is a recess 143 in which the block of the central introduction portion 55 is arranged. It should be noted that the central axis 144a (corresponding to the center of gravity G0) in the radial direction of the dielectric window 16 is indicated by a chain line in FIG. 9B.

An annular first recess 147 which is annularly continuous and is recessed in a tapered shape inward in the plate thickness direction of the dielectric window 16 is provided in a radially outer region of the lower flat surface 146 which is the side where plasma is generated when it is provided in the plasma processing apparatus, in the dielectric window 16. The flat surface 146 is provided in the radial center region of the dielectric window 16.

The annular first recess 147 has an inner tapered surface 148 with a tapered shape from the outer diameter region toward the outer diameter side of the flat surface 146, specifically, which is inclined with respect to the flat surface 146, a bottom surface 149 which extends straight in the radial direction toward the outer diameter side from the inner tapered surface 148, that is, extends parallel to the flat surface 146, and an outer tapered surface 150 with a tapered shape from the bottom surface 149 toward the outer diameter side, specifically, which extends obliquely with respect to the bottom surface 149.

The angle of taper, that is, for example, an angle defined by a direction in which the inner tapered surface extends with respect to the bottom surface 149 or an angle defined by a direction in which the outer tapered surface 150 extends with respect to the bottom surface 149 is arbitrarily determined, and in this embodiment, it is configured that the angle is the same at any position in the circumferential direction. The inner tapered surface 148, the bottom surface 149, and the outer tapered surface 150 are formed to be continuous with smooth curved surfaces, respectively. In addition, the outer diameter region of the outer tapered surface 150 is provided with an outer peripheral flat surface 152 which extends straight in the radial direction toward the outer diameter side, that is, extends parallel to the flat surface 146.

This outer peripheral flat surface 152 serves as a supporting surface of the dielectric window 16 and blocks the opening end surface of the processing vessel 2. That is, the dielectric window 16 is attached to the processing vessel 2 by placing the outer peripheral flat surface 152 on the opening end surface on the upper side of the cylindrical processing vessel 2.

It is possible to form a resonance region having the thickness of the dielectric window 16 suitable for various process conditions for generating plasma, by forming a region that continuously changes the thickness of the dielectric window 16 in the radially outer region of the dielectric window 16 by the annular first recess 147. This makes it possible to ensure the plasma stability in the radially outer region according to various process conditions.

Figure 10A:
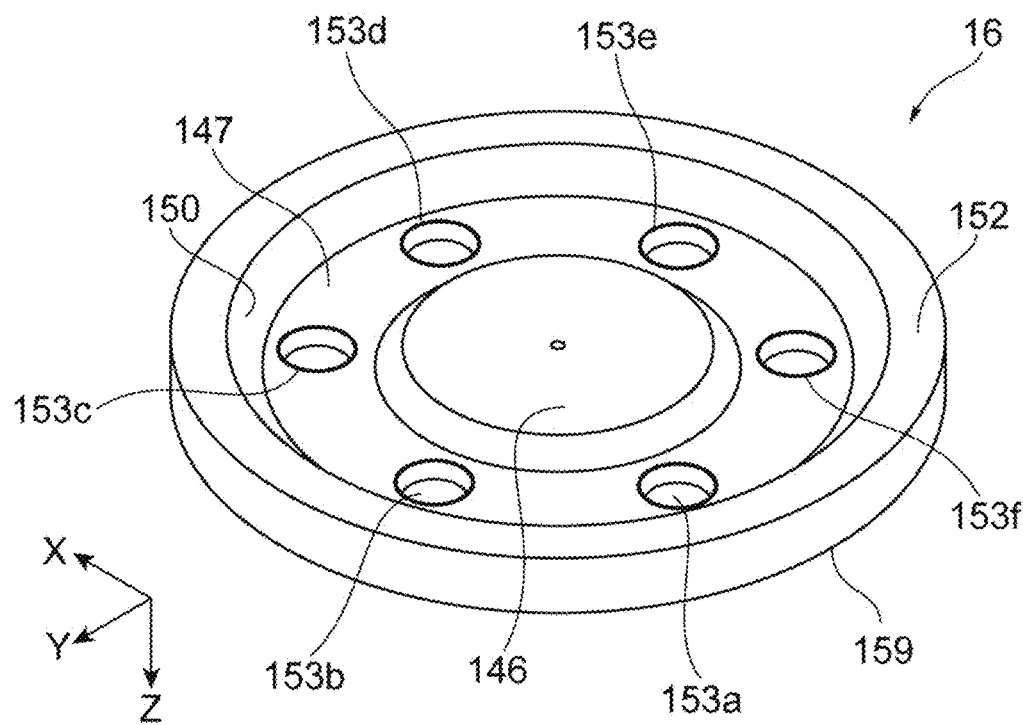
FIG. 10A is a perspective view of a dielectric window according to another example.
Figure 10B:
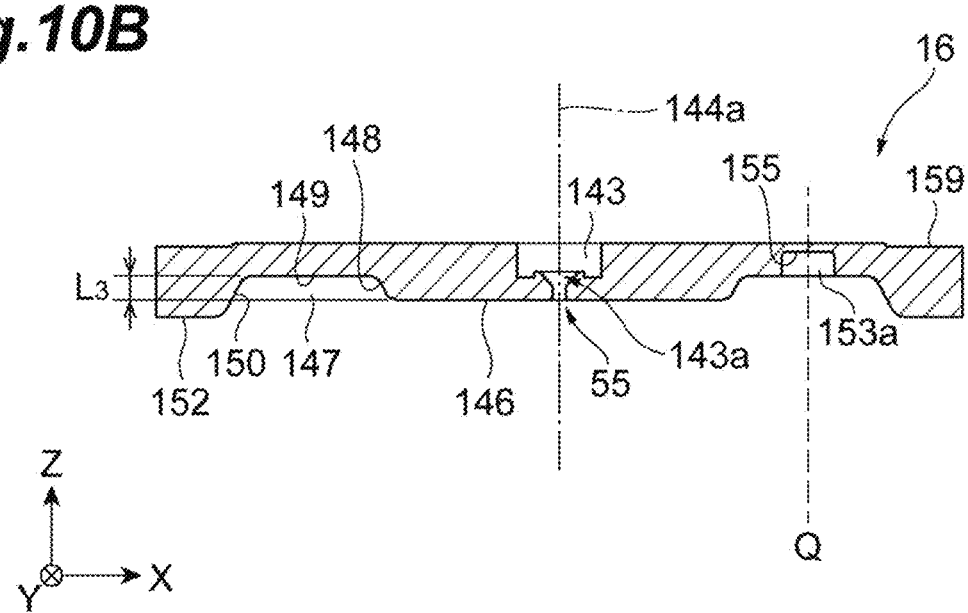
FIG. 10B is a longitudinal sectional view of the dielectric window.

FIG. 10A is a perspective view of a dielectric window according to another example, and FIG. 10B is a longitudinal sectional view of the dielectric window.

The difference between the structure of FIGS. 10A and 10B and that of FIGS. 9A and 9B is that circular second recesses 153 (153a to 153f) are formed along the circumferential direction on the bottom surface 149 of the first recess 147 at equal intervals, and other configurations are the same as those of FIGS. 9A and 9B.

As described above, on the bottom surface of the annular first recess 147 of the dielectric window 16, the second recesses 153 (153a to 153f) which are recessed inward in the plate thickness direction are provided. The planar shape of the second recess 153 is circular, the inner side surface constitutes a cylindrical surface, and the bottom surface is flat. Since the circular shape is a polygon having an infinite number of corner portions, it can be considered that the planar shape of the second recess 153 can be a polygon having a finite number of corner portions. When introducing the microwave, it is considered that plasma is generated in the recess. In a case where the planar shape is circular, the shape equivalence from the center is high, such that stable plasma is generated.

In this embodiment, a total of six second recesses 153 are provided, and this is equal to the number of outer slot groups (see FIGS. 2A and 2B). The shapes of the six second recesses 153a, 153b, 153c, 153d, 153e, and 153f are equal to each other. That is, it is configured that the concave shapes and the sizes of the second recesses 153a to 153f, the diameters of the holes, and the like are equal to each other. The six second recesses 153a to 153f are disposed with a space therebetween so as to have rotational symmetry around the center of gravity (in FIG. 10B, the position of the central axis 144a) in the radial direction of the dielectric window 16. When viewed from the plate thickness direction of the dielectric window 16, the center of gravity (Q) of each of the six second recesses 153a to 153f with a round hole shape are located on a circle with the center (central axis 144a) in the radial direction of the dielectric window 16 as a center. That is, in a case where the dielectric window 16 is rotated 60 degrees (=360 degrees/6) in the XY plane around the center in the radial direction (central axis 144a), the configuration is such that it has the same shape as before the rotation.

In this embodiment, the diameter of a circle passing through the centers of gravity of all the second recesses 153 is about 143 mm, the diameter of the second recess 153 is 50 mm, and the depth of the second recess 153 with reference to the bottom surface of the first recess 147 is 10 mm. Further, the depth $L_3$ based on the flat surface 146 of the first recess 147 is appropriately set, and is 32 mm in this embodiment.

The diameter of the second recess 153 and the distance from the bottom surface of the second recess 153 to the upper surface of the dielectric window 163 are set to, for example, a quarter of the wavelength λg of the microwave introduced therein. In this embodiment, the diameter of the dielectric window 16 is about 460 mm. Although the above numerical value can allow a change of ±10%, the condition under which the present apparatus operates is not limited to this condition, and the apparatus operates as long as the plasma is confined in the recess.

In the dielectric window 16, the plasma density tends to increase near the center, but in the present embodiment, since the second recess 153 is provided in the periphery avoiding the center, the plasma density in the periphery can be increased, such that the in-plane plasma density can be made uniform.

The second recesses 153a to 153f tend to concentrate the electric field of the microwave in the recess, and when viewing from the thickness direction of the slot plate, by matching the position (for example, G1) of the center of gravity of the slot group to the center of gravity (Q) of the second recess of the dielectric window, very strong mode fixing can be performed in the peripheral region in the radial direction of the dielectric window 16. In this case, even if the process conditions are variously changed, a strong mode-fixed region in the peripheral region in the radial direction can be secured, stable and uniform plasma can be generated, and the in-plane uniformity of the substrate throughput can be improved. In particular, since the second recesses 153a to 153f have rotational symmetry, it is possible to secure a strong mode-fixed high axial symmetry in the radially inner region of the dielectric window 16, and also they have axial symmetry for the generated plasma.

As described above, the dielectric window 16 having such a structure has a wide process margin and the generated plasma has high axial symmetry.

Figure 11:
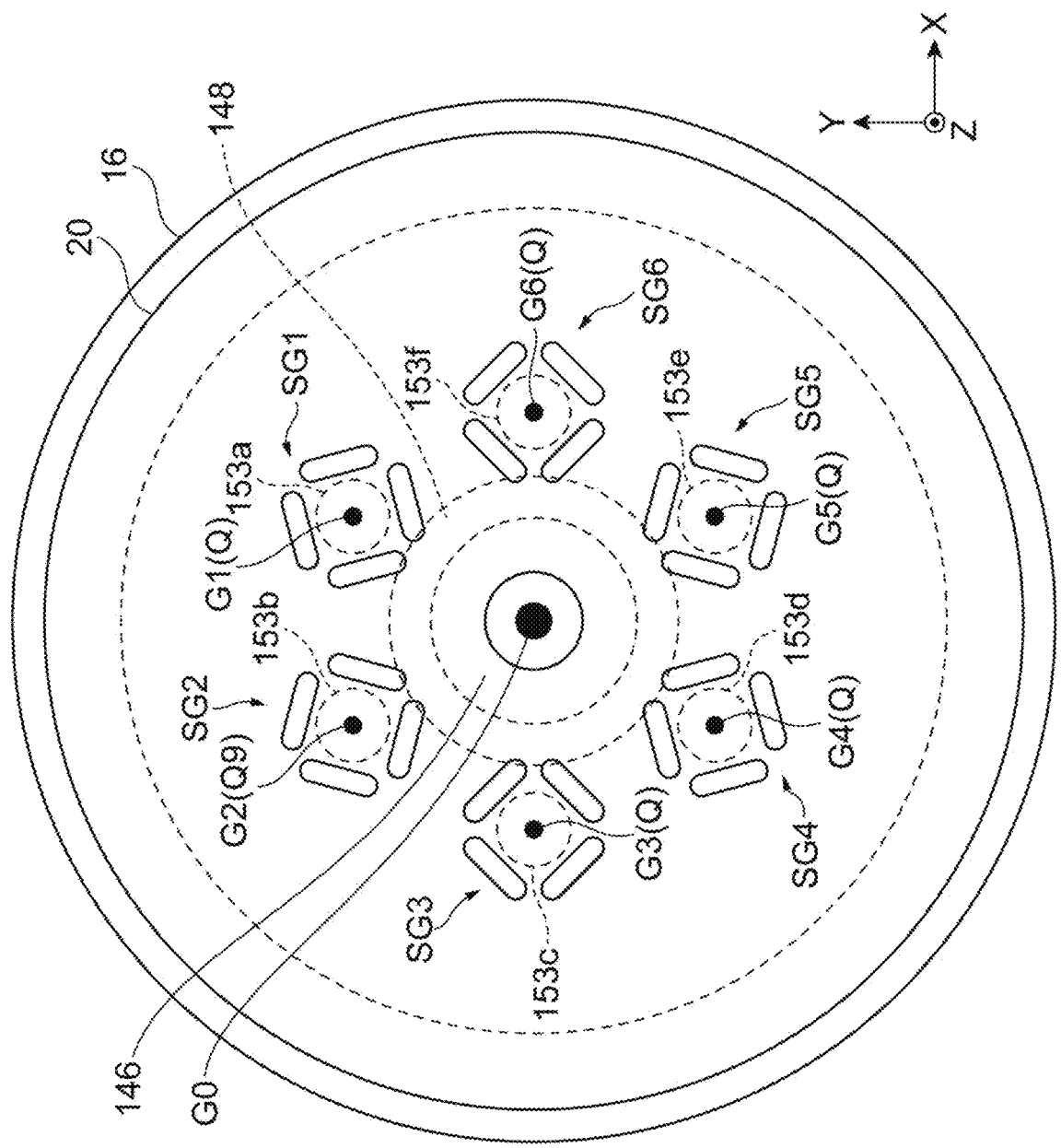
FIG. 11 is a plan view for explaining the relationship between the second recess and the slot.

FIG. 11 is a plan view (XY plane) for explaining the relationship between the second recess and the slot.

When viewed from the thickness direction (Z-axis direction) of the slot plate, the positions (G1 to G6) of centers of gravity of the slot group coincide with the centers of gravity (Q) of the second recesses 153a to 153f of the dielectric window. With this structure, the synergistic effect of the slot structure in the embodiment and the electric field concentration effect by the second recess of the dielectric window, an effect of higher electric field can be obtained.

Figure 12:
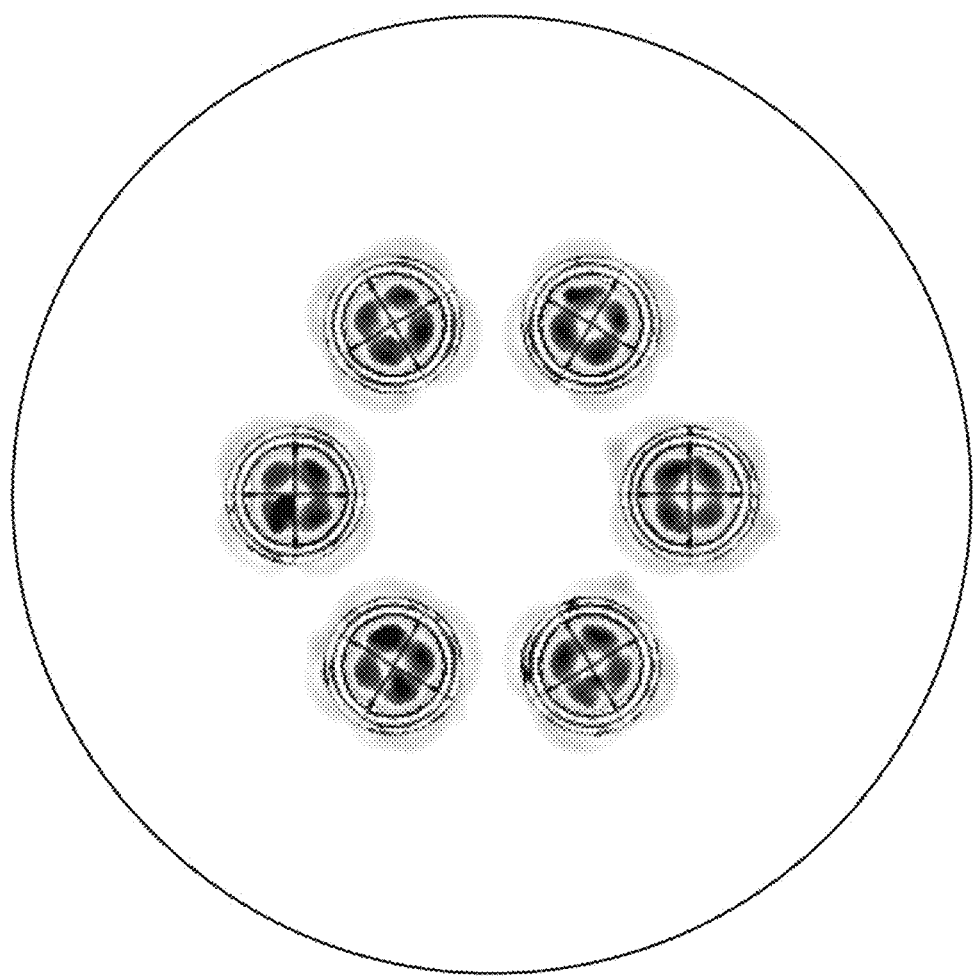
FIG. 12 is a diagram showing an example of electric field distribution.

FIG. 12 is a view showing an example (simulation) of electric field distribution. By setting the number of the second recesses to six and the number of the slot groups to six, the positions of the centers of gravity are matched. In each slot group, a cross mark line serving as a mark indicating each center is separately entered.

FIG. 12 shows the electric field intensity distribution on the lower surface of the dielectric window in the case where the electron density of the plasma is $5 \times 10^{17}$ $m^{-3}$ as an example. In a region of the second recess, the region with high electric field is fixed, and accordingly, a plasma is generated. Although the electric field distribution is measured by changing the electron density of the plasma from $1 \times 10^{17}$ $m^{-3}$ to $9 \times 10^{17}$ $m^{-3}$ by $1 \times 10^{17}$ $m^{-3}$, it is confirmed that the region with high electric field does not move and stably stays in the second recess.

Next, a pattern of one slot group will be described.

FIG. 13A, FIG. 13B, FIG. 13C, FIG. 13D, FIG. 13E, FIG. 13F, FIG. 13G, FIG. 13H, FIG. 13I, FIG. 13J, and FIG. 13K are diagrams showing examples of patterns of one slot group, respectively. A thick line indicates a slot, and an alternate long and short dashed line indicates the second virtual circle (C2).

Figure 13A:
Figure 13K:
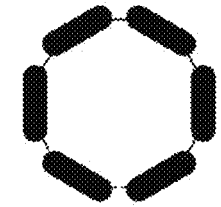
Figure 13J:
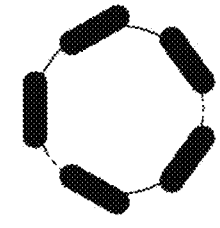
Figure 13I:
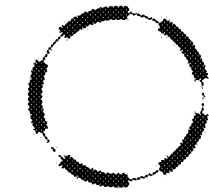

FIG. 13A is an example of the pattern of the slot group described in the above embodiment.

FIG. 13B shows an example in which there are four slots along the second virtual circle, but the planar shape of each slot is an arc (the curvature radius is the same as the second virtual circle).

FIG. 13C shows an example in which there are four slots along the second virtual circle, but the planar shape of each slot is trapezoidal.

FIG. 13D is an example in which there is a through hole (region of a black circle) of a circular diameter at the center of the pattern of the slot group described in the above embodiment.

Figure 13H:
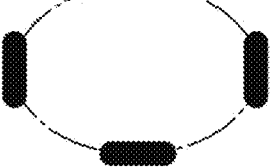
Figure 13G:
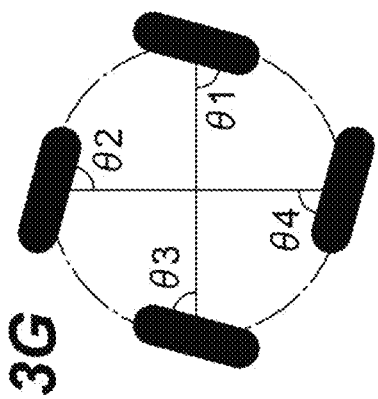
Figure 13F:
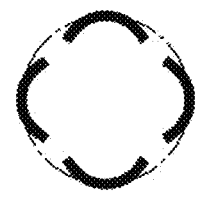
Figure 13E:
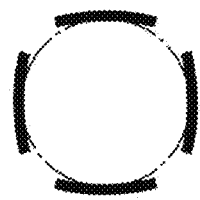

FIG. 13E shows an example in which there are four slots along the second virtual circle, but the planar shape of each slot is an arc (the curvature radius is greater than the second virtual circle).

FIG. 13F shows an example in which there are four slots along the second virtual circle, but the planar shape of each slot is an arc (the curvature radius is smaller than the second virtual circle).

FIG. 13G is an example in which as described above, there are four slots along the second virtual circle, but the longitudinal direction of each slot is different from the tangential direction of the second virtual circle at the reference position of the slot.

FIG. 13H shows an example in which the second virtual circle in FIG. 13A is a virtual ellipse (the major axis of the ellipse>the minor axis), and there are four slots along this.

FIG. 13I shows an example in which there are five slots along the second virtual circle, but the planar shape of each slot is an arc (the curvature radius is the same as the second virtual circle).

FIG. 13J shows an example in which the number of slots in the pattern of the slot group of FIG. 13A is five.

FIG. 13K shows an example in which the number of slots in the pattern of the slot group of FIG. 13A is six.

Next, a pattern of one slot will be described.

FIG. 14A, FIG. 14B, FIG. 14C, FIG. 14D, and FIG. 14E are diagrams showing examples of patterns of one slot, respectively.

Figure 14C:
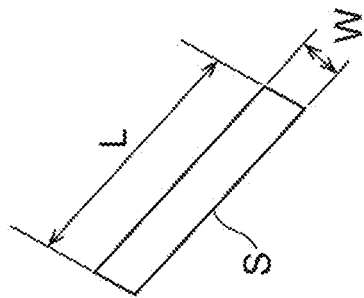
FIG. 14A, FIG. 14B, FIG. 14C, FIG. 14D, and FIG. 14E are diagrams showing examples of patterns of one slot, respectively.
Figure 14B:
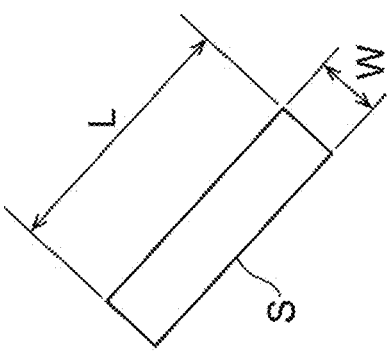
Figure 14E:
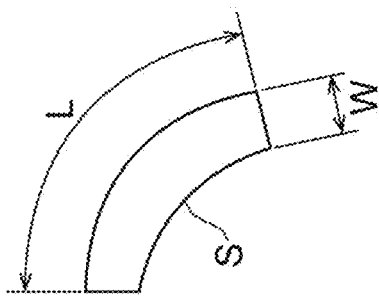
Figure 14A:
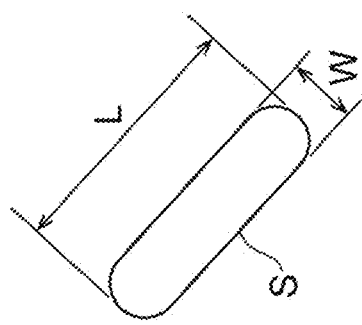

As shown in FIG. 14A, the shape of the slot S (see FIG. 5) in the above-described Example 1 is a elongated hole shape. That is, the shape of the slot S is a linearly extending shape so that the orientation in the length direction does not change. Various shapes of slots are conceivable, and as long as the orientation in the length direction does not change, there is an advantage that it is easy to form slots and it is easy to control the direction of the amplitude of the radiated electric field.

As shown in FIG. 14B, if the shape of the slot S is a rectangle, an electric field in the width direction tends to be generated, but since the corner portion of the rectangle has a high frequency component as a spatial shape, as shown in FIG. 14A, a stable electric field is generated in the elongated hole shape with rounded corners.

In short, in the antenna, it is preferable that the shape of the slot is a rectangle or an elongated hole shape, but in the case of the elongated hole shape, the generation of a noise-like radiated electric field caused by a high frequency component can be suppressed.

Figure 14D:
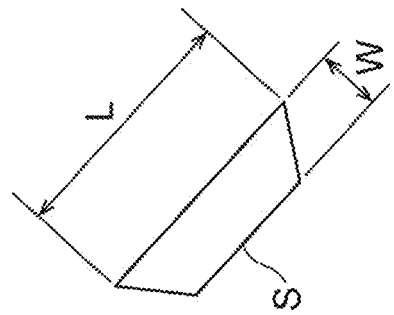

The shape of the slot may be a parallelogram as shown in FIG. 14C, it may be a trapezoid as shown in FIG. 14D, or it may be an arc shape (arcuate ring) as shown in FIG. 14E. In any of the shapes, it is easy to control the generated electric field. It is preferable that the dimension L in the length direction of each slot satisfies the following condition (L≤(3λ/2)) with respect to the wavelength λ of the microwave. This is because when L is large beyond the condition, there are cases where a plurality of antinodes of the microwave is located in the slit in some cases, which makes it difficult to control the radiated electric field. W can be appropriately changed in determining the opening ratio of the slot plate.

Further, in the slot shape of FIG. 14A, L/W=30 mm/11 mm, 32 mm/7 mm, 26 mm/9 mm, 20 mm/12 mm, 24 mm/15 mm, and the like are enumerated as specific examples. As described above, the radius of the second virtual circle C2 is preferably $L/2^{0.5}$. Further, in the above example, the slot shape is the same in the one slot group, but the slot shape or the size may be different between different groups. In addition to the rounded shape, the corner portion of the slit can be tapered. In a case where the corner portion has a radius, its curvature radius can be W/2.

As described above, the plasma processing apparatus using the antenna having any one of the slot plates and the dielectric windows described above is provided with the antenna, the processing vessel 2 to which the antenna is attached, a base which is provided inside the processing vessel 2 and faces the dielectric window, and on which the substrate to be processed is placed, and a microwave generator that supplies a microwave to the antenna. Since the plasma processing apparatus can generate plasma with high stability similarly to the above-described antenna, it is possible to perform a stable process on the substrate to be processed.

When the slot width becomes narrower, the maximum electric field intensity of the standing wave formed by the slot tends to become stronger. The fact that the electric field intensity becomes stronger means that the probability of plasma generation at that part becomes higher. The fact that the probability of plasma generation at that part becomes higher leads to the fact that plasma generation at the other parts is consequently suppressed. That is, shift of the mode hardly occurs, which leads to improvement of plasma stability and suppression of accidental fire.

Although it is considered that the microwave supplied to the antenna from the microwave generator by using the mode converter and the coaxial waveguide, as necessary, linearly propagate radially from the center of the antenna to the outer circumference portion of the antenna and propagates to a plasma space immediately below a slit portion, but in actuality, the propagation direction fluctuates depending on process conditions. In the related art, the propagation mode toward the space immediately below the slit varies depending on the positional relationship between the node and antinode of the stationary wave and the slit and the propagating component of a non-linear microwave, and it is not stable. However, in the above-described embodiment, even when various conditions fluctuate, it is possible to stably control the radiated electric field and the plasma.

What is claimed is:

1. An antenna comprising:
a dielectric window; and
a slot plate provided on one surface of the dielectric window, wherein
a plurality of center points are defined on a first circle that surrounds a center of the slot plate and, surrounding each center point of the plurality of center points, a respective second circle is defined, such that, along each second circle, a set including four or more slots is disposed to form a respective slot group, each slot including a reference position that is defined at a center position in a width direction of the slot and a center position in a length direction of the slot,
the reference position of each slot is located on the respective second circle and connected to the respective center point to which the slot belongs by a line segment that extends radially from the respective center point to the respective reference position, such that the plurality of line segments constitute adjacent line segments forming a plurality of first angles that are each equal to each other, and
a plurality of alignment angles is formed, with each respective one of the alignment angles being between a respective line segment and a line extending along the length direction of the respective slot, such that the plurality of alignment angles are each equal to each other.

2. The antenna according to claim 1, wherein
a shape of each slot is a shape extending linearly so that an orientation in the length direction does not change.

3. The antenna according to claim 2, wherein
a shape of each slot is a rectangle shape or an elongated hole shape.

4. The antenna according to claim 1, wherein
a shape of each slot is an arc shape.

5. A plasma processing apparatus comprising:
the antenna according to claim 1;
a processing vessel to which the antenna is attached;
a base which is provided inside the processing vessel and faces the dielectric window, and on which a substrate to be processed is placed; and
a microwave generator that supplies a microwave to the antenna.

6. The antenna according to claim 1, wherein
for each slot, the respective alignment angle is more than 45°.

7. The antenna according to claim 1, wherein
the dielectric window comprises a first annular recess.

8. The antenna according to claim 7, wherein
the first annular recess includes an inner tapered surface and an outer tapered surface.

9. The antenna according to claim 7, wherein
in the first annular recess, a plurality of second recesses, each having a circular shape, are formed at equal intervals along a circumferential direction of the first annular recess.

10. The antenna according to claim 9, wherein
of the plurality of center points, a location of each center point coincides with a center of a respective second recess of the plurality of second recesses.

11. The antenna according to claim 9, wherein
when viewed along a thickness direction of the slot plate, each second recess is surrounded by a respective slot group.

12. The antenna according to claim 1, wherein
a length of each slot in the length direction of the respective slot is greater than a width of the respective slot in the width direction of the respective slot.

13. The antenna according to claim 12, wherein
a length of each slot in the length direction of the respective slot is less than or equal to $3\lambda/2$, where $\lambda$ is a wavelength of a microwave radiated from the dielectric window.

* * * * *